(12) United States Patent
Markov et al.

(10) Patent No.: US 10,991,433 B2
(45) Date of Patent: Apr. 27, 2021

(54) METHOD OF IMPROVING READ CURRENT STABILITY IN ANALOG NON-VOLATILE MEMORY BY LIMITING TIME GAP BETWEEN ERASE AND PROGRAM

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/803,418

(22) Filed: Feb. 27, 2020

(65) Prior Publication Data

US 2021/0065811 A1 Mar. 4, 2021

Related U.S. Application Data

(60) Provisional application No. 62/895,458, filed on Sep. 3, 2019.

(51) Int. Cl.
*G11C 16/16* (2006.01)
*G11C 16/26* (2006.01)

(52) U.S. Cl.
CPC .............. *G11C 16/16* (2013.01); *G11C 16/26* (2013.01)

(58) Field of Classification Search
CPC ................................. G11C 16/16; G11C 16/26
See application file for complete search history.

(56) References Cited

U.S. PATENT DOCUMENTS

| | | |
|---|---|---|
| 5,029,130 A | 7/1991 | Yeh |
| 6,747,310 B2 | 6/2004 | Fan et al. |
| 6,855,980 B2 | 2/2005 | Wang et al. |
| 7,315,056 B2 | 1/2008 | Klinger |
| 7,868,375 B2 | 1/2011 | Liu et al. |
| 8,711,636 B2 | 4/2014 | Do et al. |

(Continued)

FOREIGN PATENT DOCUMENTS

JP 2002-150783 A 5/2002

OTHER PUBLICATIONS

*Negative bias temperature instability: What do we understand?* by Dieter K. Schroder, in Microelectronics Reliability 47 (2007) 841-852, Department of Electrical Engineering and Center for Solid State Electronics Research, Arizona State University, Tempe, AZ 85287-5706, USA.

*Primary Examiner* — Gene N Auduong
(74) *Attorney, Agent, or Firm* — DLA Piper LLP (US)

(57) ABSTRACT

A memory device having non-volatile memory cells and a controller. In response to a first command for erasing and programming a first group of the memory cells, the controller determines the first group can be programmed within substantially 10 seconds of their erasure, erases the first group, and programs the first group within substantially 10 seconds of their erasure. In response to a second command for erasing and programming a second group of the memory cells, the controller determines that the second group cannot be programmed within substantially 10 seconds of their erasure, divides the second group into subgroups of the memory cells each of which can be programmed within substantially 10 seconds of their erasure, and for each of the subgroups, erase the subgroup and program the subgroup within substantially 10 seconds of their erasure.

12 Claims, 3 Drawing Sheets

(56) References Cited

U.S. PATENT DOCUMENTS

| | | |
|---|---|---|
| 9,990,990 B2 * | 6/2018 | Fantini .............. G11C 13/0069 |
| 2003/0137874 A1 | 7/2003 | Furukawa |
| 2005/0083735 A1 | 4/2005 | Chen et al. |
| 2005/0276120 A1 | 12/2005 | Hsia |
| 2006/0285397 A1 | 12/2006 | Nishihara |
| 2012/0113714 A1 | 5/2012 | Choy et al. |
| 2018/0261284 A1 * | 9/2018 | Fantini .............. G11C 13/0004 |
| 2018/0308555 A1 | 10/2018 | Zhang |
| 2019/0121725 A1 | 4/2019 | Sehgal |
| 2020/0065023 A1 | 2/2020 | Markov et al. |

* cited by examiner

METHOD OF IMPROVING READ CURRENT STABILITY IN ANALOG NON-VOLATILE MEMORY BY LIMITING TIME GAP BETWEEN ERASE AND PROGRAM

RELATED APPLICATIONS

This application claims the benefit of U.S. Provisional Application No. 62/895,458 filed on Sep. 3, 2019, and which is incorporated herein by reference.

FIELD OF THE INVENTION

The present invention relates to non-volatile memory devices, and more particularly to improving the stability of the memory cell current during read operations.

BACKGROUND OF THE INVENTION

Non-volatile memory devices are well known in the art. See for example U.S. Pat. No. 7,868,375, which discloses a four-gate memory cell configuration. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed over and insulated from (and controls the conductivity of) a first portion of the channel region 18 (and partially over and insulated from the source region 14). A control gate 22 is disposed over and insulated from the floating gate 20. A select gate 24 is disposed over and insulated from (and controls the conductivity of) a second portion of the channel region 18. An erase gate 26 is disposed over and insulated from the source region 14 and is laterally adjacent to the floating gate 20. A plurality of such memory cells can be arranged in rows and columns to form a memory cell array.

Various combinations of voltages are applied to the control gate 22, select gate 24, erase gate 26 and/or source and drain regions 14/16, to program the memory cell (i.e., injecting electrons onto the floating gate), to erase the memory cell (i.e., removing electrons from the floating gate), and to read the memory cell (i.e., measuring or detecting the conductivity of the channel region 18 to determine the programming state of the floating gate 20).

Memory cell 10 can be operated in a digital manner, where the memory cell is set to one of only two possible states: a programmed state and an erased state. The memory cell is erased by placing a high positive voltage on the erase gate 26, and optionally a negative voltage on the control gate 22, to induce tunneling of electrons from the floating gate 20 to the erase gate 26 (leaving the floating gate in a more positively charged stated—the erased state). Memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate in a more negatively charged state—the programmed state). Memory cell 10 can be read by placing positive voltages on the select gate 24 (turning on the channel region portion under the select gate 24) and drain region 16 (and optionally on the erase gate 26 and/or the control gate 22), and sensing current flow through the channel region 18. If the floating gate 20 is positively charged (memory cell is erased), the memory cell will be turned on, and electrical current will flow from source region 14 to drain region 16 (i.e. the memory cell 10 is sensed to be in its erased "1" state based on sensed current flow). If the floating gate 20 is negatively charged (memory cell is programmed), the channel region under the floating gate is turned off, thereby preventing any current flow (i.e., the memory cell 10 is sensed to be in its programmed "0" state based on no current flow).

Table 1 provides non-limiting examples of erase, program and read voltages, where Vcc is power supply voltage or another positive voltage such as 2.5 V.

TABLE 1

|         | WL (SG) | BL (Drain) | Source | EG     | CG     |
|---------|---------|------------|--------|--------|--------|
| Erase   | 0 V     | 0 V        | 0 V    | 11.5 V | 0 V    |
| Program | 1 V     | 1 µA       | 4.5 V  | 4.5 V  | 10.5 V |
| Read    | Vcc     | 0.6 V      | 0 V    | 0 V    | Vcc    |

Memory cell 10 can alternately be operated in an analog manner where the memory state (i.e. the amount of charge, such as the number of electrons, on the floating gate) of the memory cell can be continuously changed anywhere from a fully erased state (fewest electrons on the floating gate) to a fully programmed state (highest number of electrons on the floating gate), or just a portion of this range. This means the cell storage is analog, which allows for very precise and individual tuning of each memory cell in the memory cell array. Alternatively, the memory could be operated as an MLC (multilevel cell) where it is configured to be programmed to one of many discrete values (such as 16 or 64 different values). In the case of analog or MLC programming, the programming voltages are applied for only a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Memory cell 10 operated in an analog manner or as an MLC could be more sensitive to noise and read current instabilities which can adversely affect the accuracy of the memory device. One source of read current instability in analog non-volatile memory devices is the capture and emission of electrons by electron traps on the gate oxide—channel interface. The gate oxide is the insulation layer that separates the floating gate 20 and the channel region 18 of substrate 12. When an electron is captured on an interface trap, it reduces the channel conductivity during a read operation, and thus increases the threshold voltage Vt of the memory cell (i.e., the minimum voltage(s) on the control gate needed to turn on the channel region of the memory cell to produce a certain level of current, 1 µA being an example). When the control gate voltage is at or above the threshold voltage, a conducting path is created between the source and drain regions. When the control gate voltage is below the threshold voltage, a conducting path is not created, and any source/drain current is considered sub-threshold or leakage current. Electron captured on an interface trap can be emitted from the trap, which decreases Vt of the memory cell, and thus increases the channel conductivity during a read operation. These single-electron events of electron capture and emission by trap result in 1) random telegraph noise (RTN) and 2) a one-directional Vt shift (also causing a one-directional change of the read current), which is referred to as relaxation or CCI—cell current instability.

Such relaxation has been detected after the memory cell has been kept for a long time at room temperature or has been baked at high temperature in one state and then changed to a different state. The relaxation appears as a small limited drift of the memory cell new state towards the preceding state. For example, if the memory cell is kept for some time in its erased state (which is characterized by a low Vt and a high channel current during a read operation), and then is subsequently programmed into its programmed state (which is characterized by a high Vt and a low channel current during a read operation), the Vt has been found to drop slightly, and the read current during a read operation has been found to increase slightly, over time under the same read conditions. The Vt and read current shifts are relatively small when compared with typical cell current operation window between "1" and "0" states for memory cells operated in a digital manner. However, these shifts may not be negligible for memory cells operated as MLC (multilevel cell) or in an analog manner.

There is a need to reduce read current instabilities in non-volatile memory devices.

BRIEF SUMMARY OF THE INVENTION

The aforementioned problems and needs are addressed by a memory device having a plurality of non-volatile memory cells and a controller. The controller is configured to receive a first command for erasing and programming a first group of the memory cells, determine that the first group of the memory cells can be programmed within substantially 10 seconds of erasure of the first group of the memory cells, erase the first group of memory cells in a group erase operation, program the first group of memory cells within substantially 10 seconds of the group erase operation, receive a second command for erasing and programming a second group of the memory cells, determine that the second group of the memory cells cannot be programmed within substantially 10 seconds of erasure of the second group of the memory cells, divide the second group of the memory cells into a plurality of subgroups of the memory cells, wherein each one of the subgroups can be programmed within substantially 10 seconds of erasure of the respective one subgroup of the memory cells, and for each of the subgroups of the memory cells, erase the subgroup of memory cells in a subgroup erase operation and program the subgroup of memory cells within substantially 10 seconds of the subgroup erase operation.

A method of operating a memory device having a plurality of non-volatile memory cells includes receiving a first command for erasing and programming a first group of the memory cells, determining that the first group of the memory cells can be programmed within substantially 10 seconds of erasure of the first group of the memory cells, erasing the first group of memory cells in a group erase operation, programming the first group of memory cells within substantially 10 seconds of the group erase operation, receiving a second command for erasing and programming a second group of the memory cells, determining that the second group of the memory cells cannot be programmed within substantially 10 seconds of erasure of the second group of the memory cells, dividing the second group of the memory cells into a plurality of subgroups of the memory cells, wherein each one of the subgroups can be programmed within substantially 10 seconds of erasure of the respective one subgroup of the memory cells, and for each of the subgroups of the memory cells, erasing the subgroup of memory cells in a subgroup erase operation and programming the subgroup of memory cells within substantially 10 seconds of the subgroup erase operation.

Other objects and features of the present invention will become apparent by a review of the specification, claims and appended figures.

DETAILED DESCRIPTION OF THE INVENTION

Figure 1:
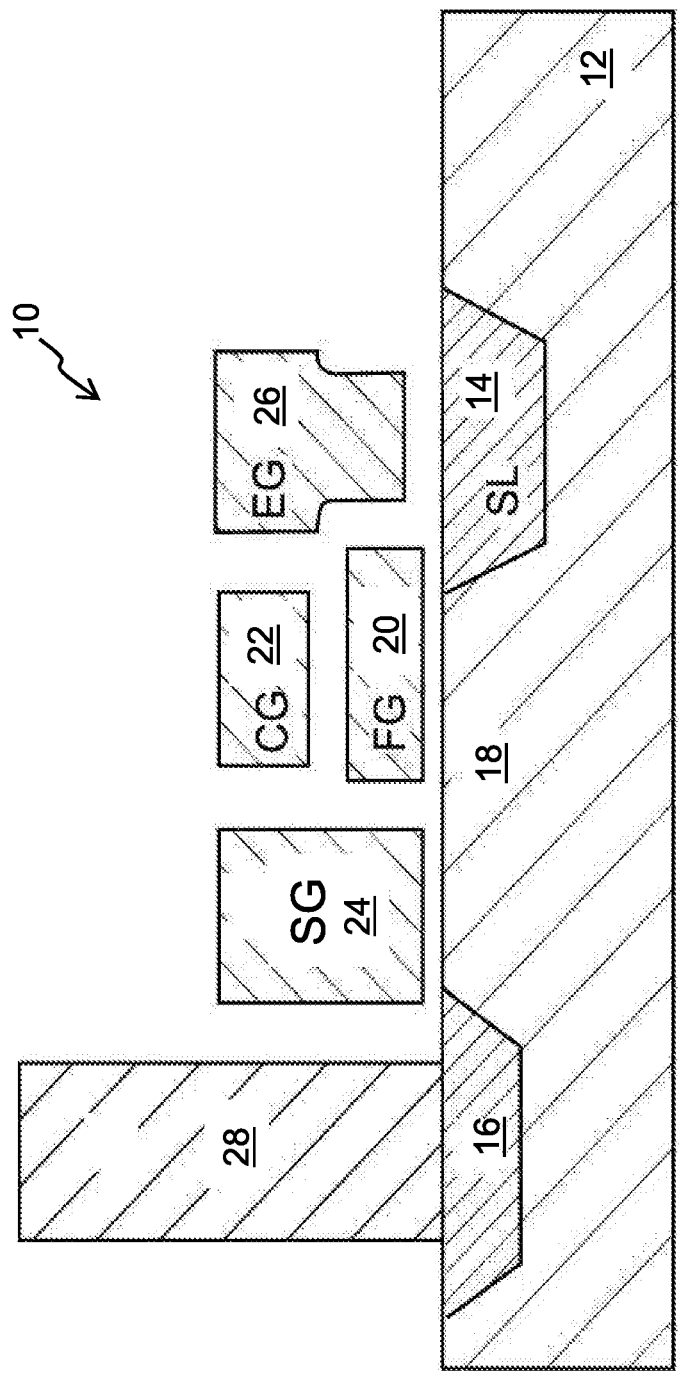
FIG. 1 is a side cross sectional view of a memory cell of the prior art.

The present invention is a technique for stabilizing the read current of non-volatile memory cells of the type of FIG. 1, preferably non-volatile memory cells operated in an analog manner, to improve read operation accuracy and memory retention longevity. Memory cells operated in an analog manner may use only an analog operating range of program states, which is only a portion of the full operating range of program states between fully erased (minimum number of electrons on the floating gate), defined herein as outside of the analog operating range of program states, and fully programmed (maximum number of electrons on the floating gate), as mentioned above. That is, over the lifetime of the memory device, the memory device can be configured such that the memory cells mostly stay within this analog operating range. Before analog programming, the array of memory cells is erased so that Vt of erased memory cells is substantially below the analog operating range. Then memory cells are programmed by the individual tuning of each memory cell so that Vt of programmed memory cells are within the analog operating range. The read stabilization technique involves configuring the controller of the memory device so that during normal operation, anytime a memory cell is erased and then programmed to a Vt value within the analog operating range, the time between memory cell erasure and memory cell programming is constrained to be substantially 10 seconds or less. It has been determined by the present inventors that if the delay between erasing a memory cell and programming the memory cell is substantially 10 seconds or less, unwanted shifts (relaxation) in channel current during subsequent read operations would be reduced or eliminated.

Figure 2:
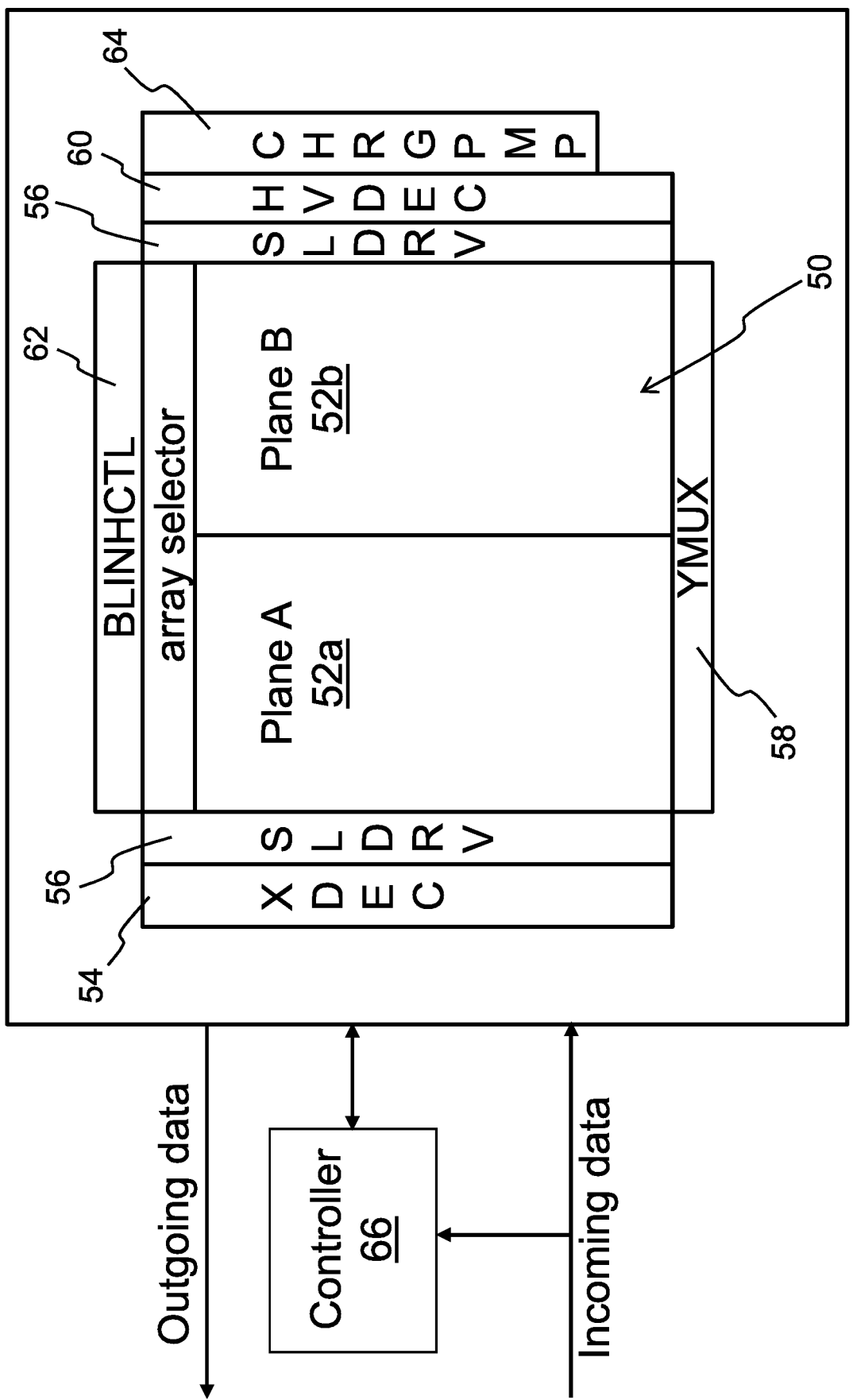
FIG. 2 is a diagram illustrating the components of a memory device.

Erasing and programming a memory array can be better understood from the architecture of an exemplary memory device as illustrated in FIG. 2. The memory device includes an array 50 of the non-volatile memory cells 10, which can be segregated into two separate planes (Plane A 52a and Plane B 52b). The memory cells 10 can be of the type shown in FIG. 1, formed on a single chip, arranged in a plurality of rows and columns in the semiconductor substrate 12. Adjacent to the array of non-volatile memory cells are address decoders (e.g. XDEC 54), a source line driver (e.g. SLDRV 56), a column decoder (e.g. YMUX 58), a high voltage row decoder (e.g. HVDEC 60) and a bit line controller (e.g.

BLINHCTL 62), which are used to decode addresses and supply the various voltages to the various memory cell gates and regions during read, program, and erase operations for selected memory cells. Column decoder 58 includes a sense amplifier containing circuitry for measuring the currents on the bit lines during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. Controller 66 is configured to operate the memory device to program, erase and read the memory cells 10. As part of these operations, the controller 66 is provided access to the incoming data which is data to be programmed to the memory cells (and which can include erase/program commands provided on the same or different lines before, during or after the data is provided). Separate read and erase commands can also be provided. Data read from the memory array is provided as outgoing data.

For efficiency, the memory device is preferably configured to erase a plurality of memory cells at the same time in a single erase operation. For example, an entire row or column of memory cells can be erased simultaneously. Or, an entire block of rows and columns can be erased at the same time. Therefore, the controller 66 is configured to select the number of memory cells to be erased simultaneously for any given erase/program operation so that the subsequent programming of those erased memory cells can be completed within substantially 10 seconds after erasure. For example, for any group of memory cells being simultaneously erased, the 10 seconds is measured from when the erasure of the group of memory cells is completed to when the programming of the last memory cell in the group is completed. If a particular erase/program operation involves a given number of memory cells that could not be erased and programed within substantially 10 seconds, then the controller 66 is configured to operate (erase and program) on groups of those memory cells one group at a time to ensure all the memory cells are programmed within substantially 10 seconds or less from when they were erased.

For example, if it takes substantially 10 seconds for the controller 66 to program X number of memory cells after an erase operation, then any erase/program operation involving Y memory cells, where Y is greater than X, would cause the controller to divide the Y memory cells into two or more groups each not exceeding X number of memory cells, whereby the erase/program operation is applied to each group one at a time so that the programming of all the memory cells in each group can be completed within substantially 10 seconds or less of when that group of memory cells is erased. Therefore, for each erase/programming operation, the controller performs that operation so that all programming of any given number of memory cells is completed within substantially 10 seconds of when erasure of those same memory cells is completed.

Figure 3:
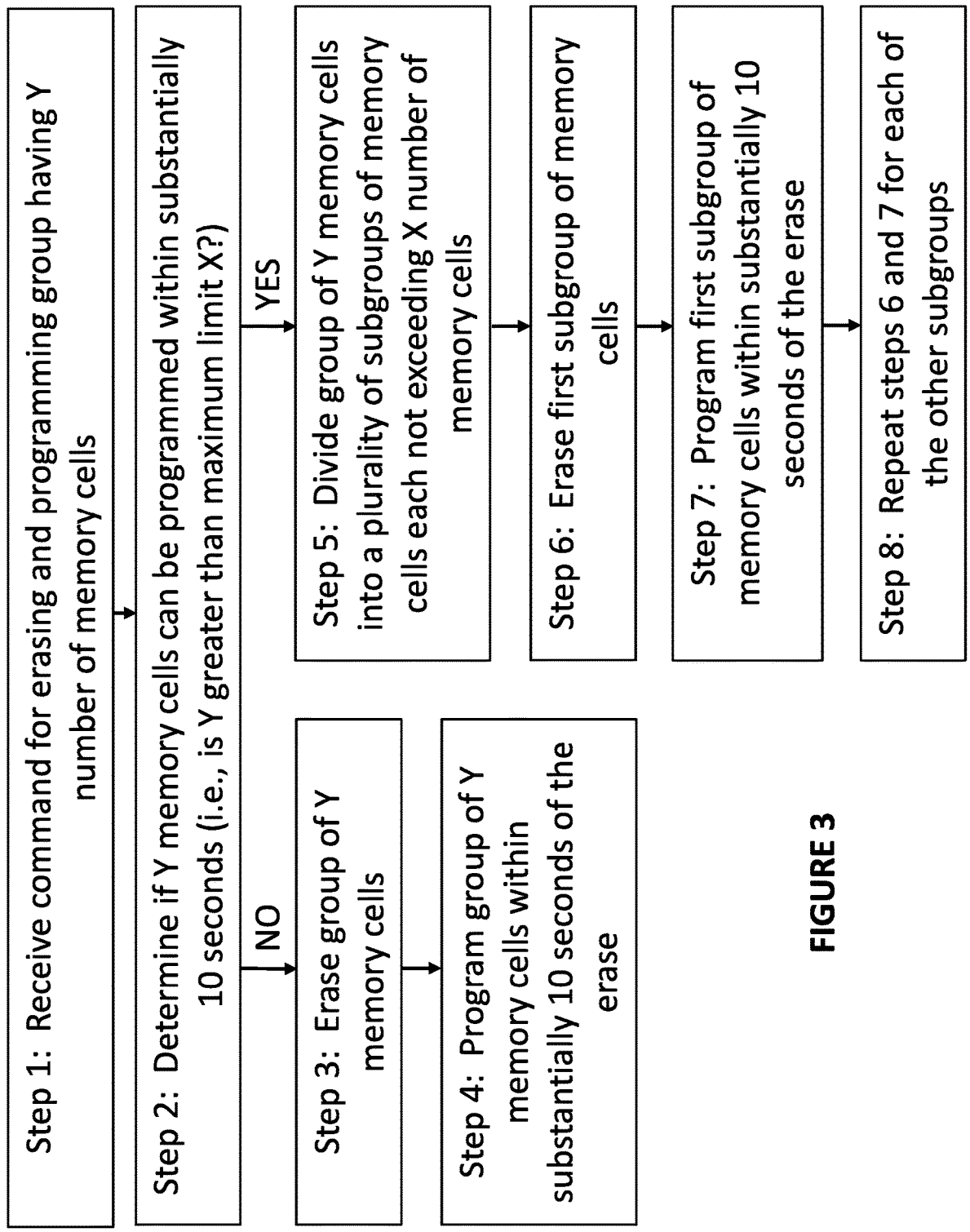
FIG. 3 is a flow diagram showing the steps of erasing and programming memory cells.

FIG. 3 illustrates the steps of the present invention. In Step 1, the controller 66 receives a (first) command to erase and program a group of the memory cells having Y memory cells in the group. In Step 2, the controller 66 determines if Y is greater than X, where X is the highest number of memory cells that can be programmed within substantially 10 seconds after the erase is completed (i.e., a maximum limit). This step determines if the Y number of memory cells can be programmed within substantially 10 seconds of the erasure of the Y number of memory cells. If Y is not greater than X, then the Y number of memory cells can be programmed within substantially 10 seconds of erasure of the Y number of memory cells, and therefore in Step 3 the controller 66 erases the entire Y number of memory cells in the group (preferably, but not necessarily, simultaneously), and in step 4 the controller 66 programs the Y number of memory cells in the group within substantially 10 seconds of the erase. However, if in step 2 it is determined that Y is greater than X, then the Y number of memory cells cannot be programmed within substantially 10 seconds of erasure of the Y number of memory cells, and therefore in step 5 the controller divides the group of Y memory cells into a plurality of subgroups of memory cells each not exceeding X. The controller 66 then erases the first subgroup of memory cells in Step 6 (preferably, but not necessarily, simultaneously), and programs the first subgroup of memory cells within substantially 10 seconds of the erase in Step 7. Then, in Step 8, the controller 66 repeats Steps 6 and 7 for each of the other subgroups of memory cells. The process is repeated each time an erase/program command (i.e., second command, third command, etc.) is received. With this technique, all memory cells are programmed within substantially 10 seconds of their erasure no matter how many memory cells are targeted by the command for erase and programming.

To illustrate the above described technique, a non-limiting example can be an 8 Mbit digital NOR flash memory device with each byte (8 bits) programmed in a digital manner by a single pulse with a 10 µs time duration. With this example, the total programming time for this device can take a minimum of 10 seconds. However, the precise analog programming of the data can take a substantially longer time to include multiple program and read verification steps in the programming algorithm. For example, meeting a required precision for analog programming can require 100 programming pulses, each pulse of 0.9 µs, and a read verification in-between the programming pulses with a duration of 0.1 µs. In this example, the total analog programming time for 1 million bytes would take 100 seconds at a minimum. Therefore, in this case, the erase operation performed before analog programming would not be performed for the entire flash memory device, but rather only for a block of memory cells within the flash memory device that is at least 10 times smaller than array, so that the programming time for the just-erased block will not exceed substantially 10 seconds.

It should be noted that the advantages of the present invention are achieved by preventing any memory cell from staying in its erased state by more than substantially 10 seconds. Therefore, according to the present invention, for any group of memory cells that are erased, each of the memory cells in the group is subjected to at least some programming within substantially 10 seconds, even if some of the memory cells are not slated to be programmed with data. For example, if a memory cell in a group of cells being erased is not slated to be programmed with any data, the memory cell could be fully programmed or deeply over-programmed so as to be outside of the analog operating range, effectively minimizing any contribution this memory cell may add to the bit line current when other memory cells on the same bit line are being read. Therefore, no matter what data is being programmed to a group of memory cells subjected to erasure, all the memory cells in the group are programmed so that no memory cell is left in the erased state for more than substantially 10 seconds (see step 4 or steps 7-8 of FIG. 3). As used herein, programming a group or plurality of memory cells means that each memory cell in the group or plurality is subjected to at least some programming (i.e., at least some injection of electrons onto the floating gate).

It is to be understood that the present invention is not limited to the embodiment(s) described above and illustrated herein but encompasses any and all variations falling within the scope of any claims. For example, references to the present invention herein are not intended to limit the scope of any claim or claim term, but instead merely relate to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed unless specified.

What is claimed is:

1. A memory device comprising:
    a plurality of non-volatile memory cells;
    a controller configured to:
        receive a first command for erasing and programming a first group of the memory cells,
        determine that the first group of the memory cells can be programmed within substantially 10 seconds of erasure of the first group of the memory cells,
        erase the first group of memory cells in a group erase operation,
        program the first group of memory cells within substantially 10 seconds of the group erase operation,
        receive a second command for erasing and programming a second group of the memory cells,
        determine that the second group of the memory cells cannot be programmed within substantially 10 seconds of erasure of the second group of the memory cells,
        divide the second group of the memory cells into a plurality of subgroups of the memory cells, wherein each one of the subgroups can be programmed within substantially 10 seconds of erasure of the respective one subgroup of the memory cells, and
        for each of the subgroups of the memory cells:
            erase the subgroup of memory cells in a subgroup erase operation, and
            program the subgroup of memory cells within substantially 10 seconds of the subgroup erase operation.

2. The device of claim 1, wherein the controller is further configured to simultaneously erase at least all of the memory cells in the first group of the memory cells in the group erase operation.

3. The device of claim 1, wherein for each of the subgroups of the memory cells, the controller is further configured to simultaneously erase at least all of the memory cells in the subgroup of the memory cells in the subgroup erase operation.

4. The device of claim 1, wherein the controller is configured to determine that the first group of the memory cells can be programmed within substantially 10 seconds of erasure of the first group of the memory cells based on a number of the memory cells in the first group of the memory cells does not exceed a predetermined number, and to determine that the second group of the memory cells cannot be programmed within substantially 10 seconds of erasure of the second group of the memory cells based on a number of the memory cells in the second group of the memory cells does exceed the predetermined number.

5. The device of claim 1, wherein each of the memory cells comprises:
    spaced apart source and drain regions formed in a semiconductor substrate, with a channel region of the substrate extending there between,
    a floating gate disposed vertically over and insulated from a first portion of the channel region,
    a select gate disposed vertically over and insulated from a second portion of the channel region, and
    a control gate disposed vertically over and insulated from the floating gate.

6. The device of claim 5, wherein each of the memory cells further comprises:
    an erase gate disposed over and insulated from the source region.

7. A method of operating a memory device having a plurality of non-volatile memory cells, comprising:
    receiving a first command for erasing and programming a first group of the memory cells,
    determining that the first group of the memory cells can be programmed within substantially 10 seconds of erasure of the first group of the memory cells,
    erasing the first group of memory cells in a group erase operation,
    programming the first group of memory cells within substantially 10 seconds of the group erase operation,
    receiving a second command for erasing and programming a second group of the memory cells,
    determining that the second group of the memory cells cannot be programmed within substantially 10 seconds of erasure of the second group of the memory cells,
    dividing the second group of the memory cells into a plurality of subgroups of the memory cells, wherein each one of the subgroups can be programmed within substantially 10 seconds of erasure of the respective one subgroup of the memory cells, and
    for each of the subgroups of the memory cells:
        erasing the subgroup of memory cells in a subgroup erase operation, and
        programming the subgroup of memory cells within substantially 10 seconds of the subgroup erase operation.

8. The method of claim 7, wherein the erasing the first group of memory cells further comprises simultaneously erasing at least all of the memory cells in the first group of the memory cells.

9. The method of claim 7, wherein for each of the subgroups of the memory cells, the erasing the subgroup of the memory cells further comprises simultaneously erasing at least all of the memory cells in the subgroup of the memory cells.

10. The method of claim 7, wherein the determining that the first group of the memory cells can be programmed within substantially 10 seconds of erasure of the first group of the memory cells is based on a number of the memory cells in the first group of the memory cells does not exceed a predetermined number, and the determining that the second group of the memory cells cannot be programmed within substantially 10 seconds of erasure of the second group of the memory cells is based on a number of the memory cells in the second group of the memory cells does exceed the predetermined number.

11. The method of claim 7, wherein each of the memory cells comprises:
    spaced apart source and drain regions formed in a semiconductor substrate, with a channel region of the substrate extending there between, a floating gate disposed vertically over and insulated from a first portion of the channel region,
a select gate disposed vertically over and insulated from a second portion of the channel region, and
a control gate disposed vertically over and insulated from the floating gate.

12. The method of claim 11, wherein each of the memory cells further comprises:
an erase gate disposed over and insulated from the source region.

* * * * *